(12) United States Patent
Kang et al.

(10) Patent No.: US 7,695,596 B2
(45) Date of Patent: *Apr. 13, 2010

(54) DEVICE FOR FIXING SUBSTRATE FOR THIN FILM SPUTTER AND METHOD OF FIXING SUBSTRATE USING THE SAME

(75) Inventors: Chang Ho Kang, Yangsan (KR); Yong Weon Jang, Yangsan (KR); Tae Seung Kim, Busan (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 759 days.

This patent is subject to a terminal disclaimer.

(21) Appl. No.: 11/434,722

(22) Filed: May 17, 2006

(65) Prior Publication Data

US 2006/0201618 A1 Sep. 14, 2006

Related U.S. Application Data

(63) Continuation of application No. 10/448,141, filed on May 30, 2003, now Pat. No. 7,097,750.

(30) Foreign Application Priority Data

May 31, 2002 (KR) ................. 2002-30613

(51) Int. Cl.
*C23C 14/34* (2006.01)
*C23C 16/00* (2006.01)
(52) U.S. Cl. .............. 204/192.1; 204/192.12; 204/298.11; 427/282; 118/504; 118/505; 118/720; 118/721
(58) Field of Classification Search .............. 204/192.1, 204/192.12, 298.11; 427/282; 118/504, 118/505, 720, 721
See application file for complete search history.

(56) References Cited

U.S. PATENT DOCUMENTS

| 4,011,143 A | 3/1977 | Del Monte et al. |
| 4,599,970 A | 7/1986 | Peterson |
| 4,915,057 A | 4/1990 | Boudreau et al. |
| 5,833,823 A | 11/1998 | Gruenenfelder et al. |
| 6,132,575 A | 10/2000 | Pandumsoporn et al. |
| 6,251,233 B1 | 6/2001 | Plester et al. |

FOREIGN PATENT DOCUMENTS

| JP | 4-112535 | 4/1992 |
| JP | 8-297869 | 11/1996 |
| JP | 11-158605 | 6/1999 |
| JP | 2002-75638 | 3/2002 |
| JP | 2002-075638 | 3/2002 |
| JP | 2002-212704 | 7/2002 |

OTHER PUBLICATIONS

Korean Office Action Issued Dec. 13, 2007.
U.S. Appl. No. 10/448,141, filed May 30, 2003, Chang Ho Kang et al., Samsung SDI Co., Ltd.
Office Action issued by the State Intellectual Property Office of the People's Republic of China on May 8, 2009.
Office Action issued in Japanese Patent Application No. 2003-156776 on Aug. 25, 2009.

*Primary Examiner*—Rodney G McDonald
(74) *Attorney, Agent, or Firm*—Stein McEwen, LLP (57) ABSTRACT

A device to fix a substrate for a thin film sputter, includes a mask, a mask pressing plate, a magnetic body, and a driving unit. The mask having patterns is positioned under the substrate so as to form the patterns on the substrate. The mask pressing plate is positioned over the substrate and moves toward and contacts a back surface of the substrate at a predetermined pressure. The magnetic body is placed over the mask pressing plate and moves toward the mask pressing plate so as to have the mask adhere closely to the substrate by a magnetic force of the magnetic body. The driving unit applies a driving force to move the magnetic body. Where the mask pressing plate descends, the mask pressing plate adheres closely to the substrate. Thereafter, the magnetic body descends toward the back surface of the substrate which is supported by the mask pressing plate. The mask underneath the substrate adheres closely to a front surface of the substrate by the magnetic force of the magnetic body. Accordingly, since the substrate is multi-step supported, the alignment of the mask underneath the substrate is not dislocated.

11 Claims, 7 Drawing Sheets

DEVICE FOR FIXING SUBSTRATE FOR THIN FILM SPUTTER AND METHOD OF FIXING SUBSTRATE USING THE SAME

CROSS-REFERENCE TO RELATED APPLICATIONS

This application is a continuation of U.S. patent application Ser. No. 10/448,141 filed on May 30, 2003, now U.S. Pat. No. 7,097,750 issued on Aug. 29, 2006, which claims the benefit of Korean Patent Application No. 2002-30613, filed May 31, 2002, in the Korean Intellectual Property Office, the disclosures of which are incorporated herein by reference.

BACKGROUND OF THE INVENTION

1. Field of the Invention

The present invention relates to a device which fixes a substrate, and more particularly, to a device, which fixes a substrate for a thin film sputter, having an improved structure so as to uniformly deposit thin films on the substrate, and a method of fixing the substrate using the same.

2. Description of the Related Art

Organic electroluminesence displays are spontaneous luminescence type displays, which electrically excite a fluorescent organic compound to emit light. The organic electroluminesence displays have advantages in that they can be driven at a low voltage and manufactured with a narrow thickness. The organic electroluminesence displays are viewed by many as next generation displays which can solve many of the disadvantages associated with, for example, liquid crystal displays (LCDs), by having, for example, a wide view angle (WVA) and a fast response time.

Where power is supplied, a current flows with the movement of electrons in the organic electroluminescence displays. In other words, in a cathode, electrons move to a light-emitting layer via the assistance of an electron transport layer, while in an anode, holes move to the light-emitting layer via the assistance of a hole transport layer. The electrons and holes in the light-emitting layer made of an organic material create an exciton having a high energy. Here, a drop in energy of the exciton causes light to be emitted. Light of full color can be realized depending on the kind of an organic material of the light-emitting layer.

Generally, an organic electroluminescence display having the above-described structure is formed by a vacuum deposition method to form organic thin films, such as an electron transport layer, a hole transport layer, a light-emitting layer, or the like. In this vacuum deposition method, a substrate, on which organic thin films will be formed, is mounted inside a vacuum chamber in which a pressure is controlled to be within a range of $10^{-6}$-$10^{-7}$ torr. Next, an organic material contained in a furnace is sublimated so that the organic material is deposited on the substrate. U.S. Pat. Nos. 5,833,823, 6,132,575 and 6,251,233B1 disclose such a vaccum deposition method.

Figure 1A:
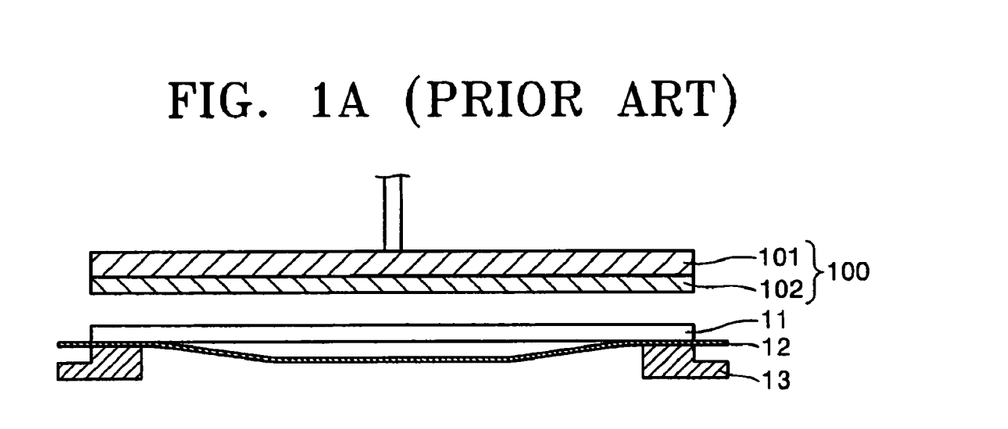
FIG. 1A is a partial view of a conventional device for fixing a substrate, which is aligned over the substrate.
Figure 1B:
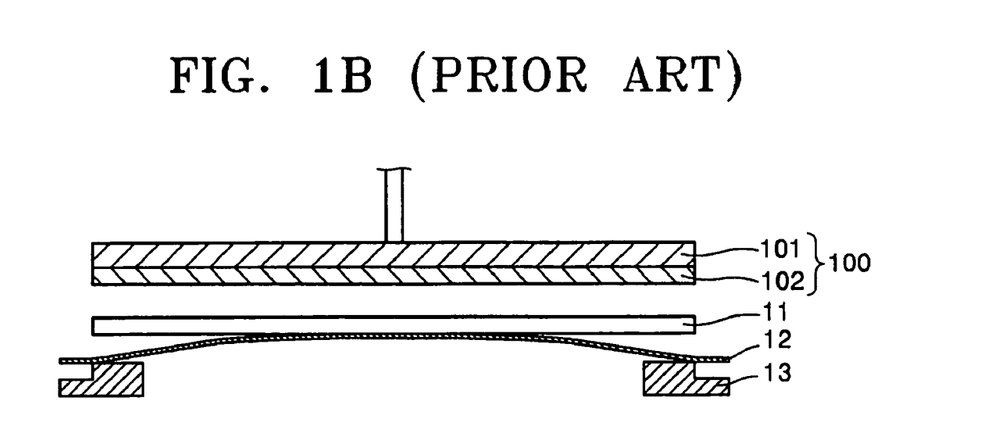
FIG. 1B is a view illustrating the device shown in FIG. 1A, which descends toward the substrate.

FIGS. 1A and 1B show a portion of a conventional sputter which fixes a substrate so as to form thin films on the substrate. As shown in FIG. 1A, a substrate 11 is mounted over a frame 13. A mask 12, which has predetermined patterns to be formed on the substrate 11, is positioned between the substrate 11 and the frame 13. A fixture 100 is disposed over the substrate 11 to support the substrate 11. The fixture 100 includes a magnet plate 101 and a rubber magnet 102 which is attached onto a backside of the magnet plate 101.

The fixture 100 is positioned over the substrate 11 via a robot carrier (not shown) to support the substrate 11, and the mask 12 is aligned underneath the substrate 11.

As shown in FIG. 1B, the fixture 100 descends to the substrate 11. Then, the mask 12, which is made of a metallic material and is positioned underneath the substrate 11, is deformed toward the fixture 100 having a magnetic force and adheres closely to the substrate 11.

The rubber magnet 102 of the fixture 100 is placed on a back surface of the substrate 11 so as to support the substrate 11. In this manner, where the mask 12 is closely adhered to the substrate 11, a sputtering operation is performed.

However, where a distance between the mask 12 and the fixture 100 is narrow, a central portion of the mask 12 ascends first. In this case, while the central portion of the mask 12 may satisfactorily adhere closely to the substrate 11, both margins of the mask 12 do not properly adhere closely to the substrate 11.

As a result, patterns are not formed in right positions of the substrate 11 and are spread to other portions. Also, where the central portion of the mask 12 ascends prior to other portions of the mask 12, as the mask 12 adheres closely to the substrate 11, the mask 12 slips underneath the substrate 11. Therefore, the substrate 11 may be scratched by the mask 12.

Figure 2A:
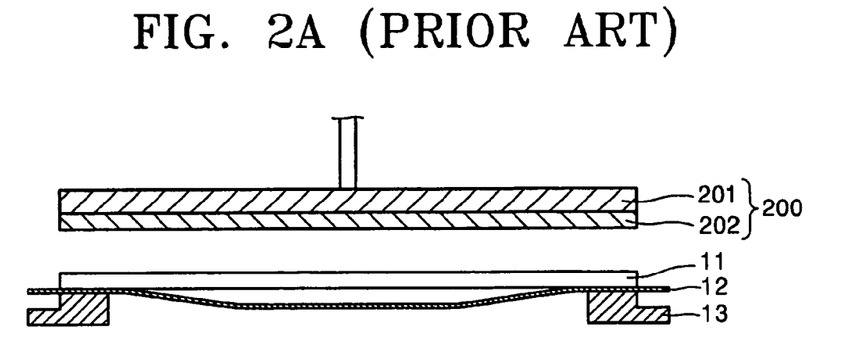
FIG. 2A is a partial view of another conventional device for fixing a substrate, which is aligned over the substrate.
Figure 2B:
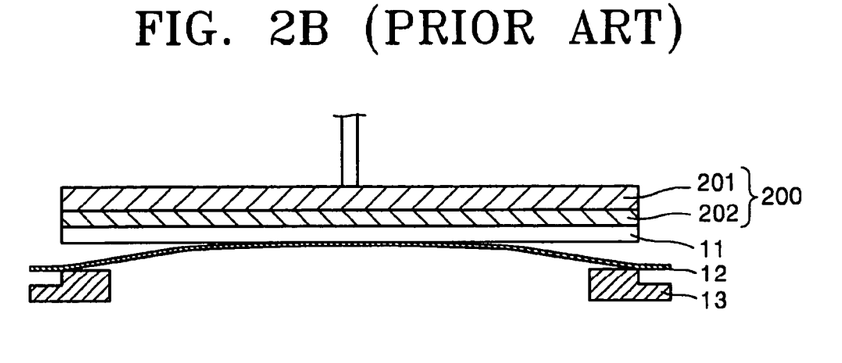
FIG. 2B is a view illustrating the device shown in FIG. 2A, which descends toward the substrate.
Figure 2C:
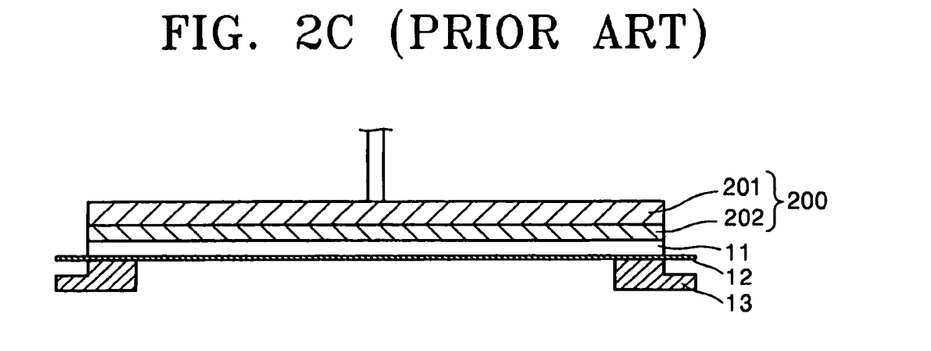
FIG. 2C is a view illustrating the device shown in FIG. 2B, which adheres to the substrate.

To solve these problems, a conventional fixture 200 shown in FIG. 2A through 2C has been suggested. The fixture 200 includes a rubber magnet 201 and a mask pressing plate 202 which is adhered onto a lower surface of the rubber magnet 201. A process of fixing the substrate 11 using the fixture 200 will be now described.

First, the fixture 200 is transferred over the substrate 11 via a robot carrier, (not shown) and a mask 12 is aligned underneath the substrate 11. Thereafter, as shown in FIG. 2B, the fixture 200 descends while the mask 12, which is made of a metallic material and is positioned underneath the substrate 11, ascends by a magnetic force of the rubber magnet 201. Here, the mask pressing plate 202 contacts the back surface of the substrate 11.

Next, as shown in FIG. 2C, the mask pressing plate 202 may completely press the substrate 11 so that the mask 12 adheres closely to and is fixed to the substrate 11. Thereafter, a sputtering operation is performed.

However, it is difficult for the mask 12 to completely adhere closely to the substrate 11 since a contact surface of a frame 13 with the mask 12 has the flatness of about 50 micrometers.

Accordingly, in order to improve a close adhesiveness between the substrate 11 and the mask 12, a magnetic force which is stronger than a magnetic force of the rubber magnet 201 has to be used, or a pressing force has to be increased/strengthened. However, where a magnetic body having a magnetic force stronger than the magnetic force of the rubber magnet 201 is used, the mask 12 slips underneath the substrate 11. As a result, an alignment of the mask 12 underneath the substrate 11 may be dislocated, or a leakage current may flow over a completed product. Furthermore, a method of strengthening an adhesive force between the substrate 11 and the mask 12 may crack or scratch the substrate 11.

SUMMARY OF THE INVENTION

Accordingly, it is an aspect of the present invention to provide a device to fix a substrate for a thin film sputter by which uniform patterns can be formed on the substrate, by multi-step supporting the substrate in a vacuum deposition process so as to improve the close adhesion of a mask to the substrate, and a method of fixing the substrate using the same.

Additional aspects and advantages of the invention will be set forth in part in the description which follows and, in part, will be obvious from the description, or may be learned by practice of the invention.

To achieve the above and/or other aspects of the present invention, there is provided a device for fixing a substrate with respect to a mask provided below the substrate, the device comprising a mask pressing body which is positioned over the substrate, and moves toward and contacts the substrate at a predetermined pressure, a magnetic body which is placed over the mask pressing plate and moves toward the mask pressing plate so as to adhere the mask to the substrate using a magnetic force of the magnetic body, and a driving unit which moves the magnetic body.

The device may further comprise guide bars which are connected to the mask pressing body and guide units which are provided at respective ends of the guide bars, wherein the guide bars ascend and descend through the magnetic body. The guide bars may slide down through the guide units by their own weight so as to have the mask pressing body descend toward the back surface of the substrate.

The device may further comprise elastic bias units installed at the guide bars to apply a set pressure to the mask pressing body.

The mask pressing body may be a nonmagnetic plate.

The magnetic body may include a magnet plate and a rubber magnet which is attached onto a lower surface of the magnet plate.

To achieve the above and/or other aspects of the present invention, there is provided another device for fixing a substrate with respect to a mask provided below the substrate, the device comprising a mask pressing body which is positioned over the substrate, an elevating unit which moves the substrate and the mask toward the mask pressing body so as to have the substrate contact the mask pressing body, a magnetic body which is placed over the mask pressing plate and moves toward the mask pressing plate so as to adhere the mask to the substrate using a magnetic force of the magnetic body, and a driving unit which moves the magnetic body.

To achieve the above and/or other aspects of the present invention, there is provided yet another device for fixing a substrate with respect to a mask provided below the substrate, the device comprising a multi-step fixing unit which contacts the substrate with a non-magnetic part thereof and adheres the mask to the substrate using a magnetic force of a magnetic part thereof, and a driving unit which drives the multi-step fixing unit.

To achieve the above and/or other aspects of the present invention, there is provided a method of fixing a substrate with respect to a mask provided below the substrate, using a device having a magnetic body, a driver and a mask pressing plate which are provided above the substrate, the method comprising adhering the mask pressing plate to the substrate, allowing the magnetic body to move toward a back surface of the substrate which is supported by the mask pressing plate, and adhering the mask underneath the substrate to a front surface of the substrate by using a magnetic force of the magnetic body.

The adhering of the mask pressing plate to the substrate comprises moving the mask pressing plate towards the back surface of the substrate, perpendicular to the magnetic body, so as to adhere the mask pressing plate to the substrate.

The adhering of the mask pressing plate to the substrate comprises moving the substrate and the mask underneath the substrate toward a front surface of the mask pressing plate, at the same time, so as to adhere the substrate to the mask pressing plate

BRIEF DESCRIPTION OF THE DRAWINGS

These and/or other aspects and advantages of the present invention will become apparent and more readily appreciated from the following description of the embodiments, taken in conjunction with the accompanying of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 3:
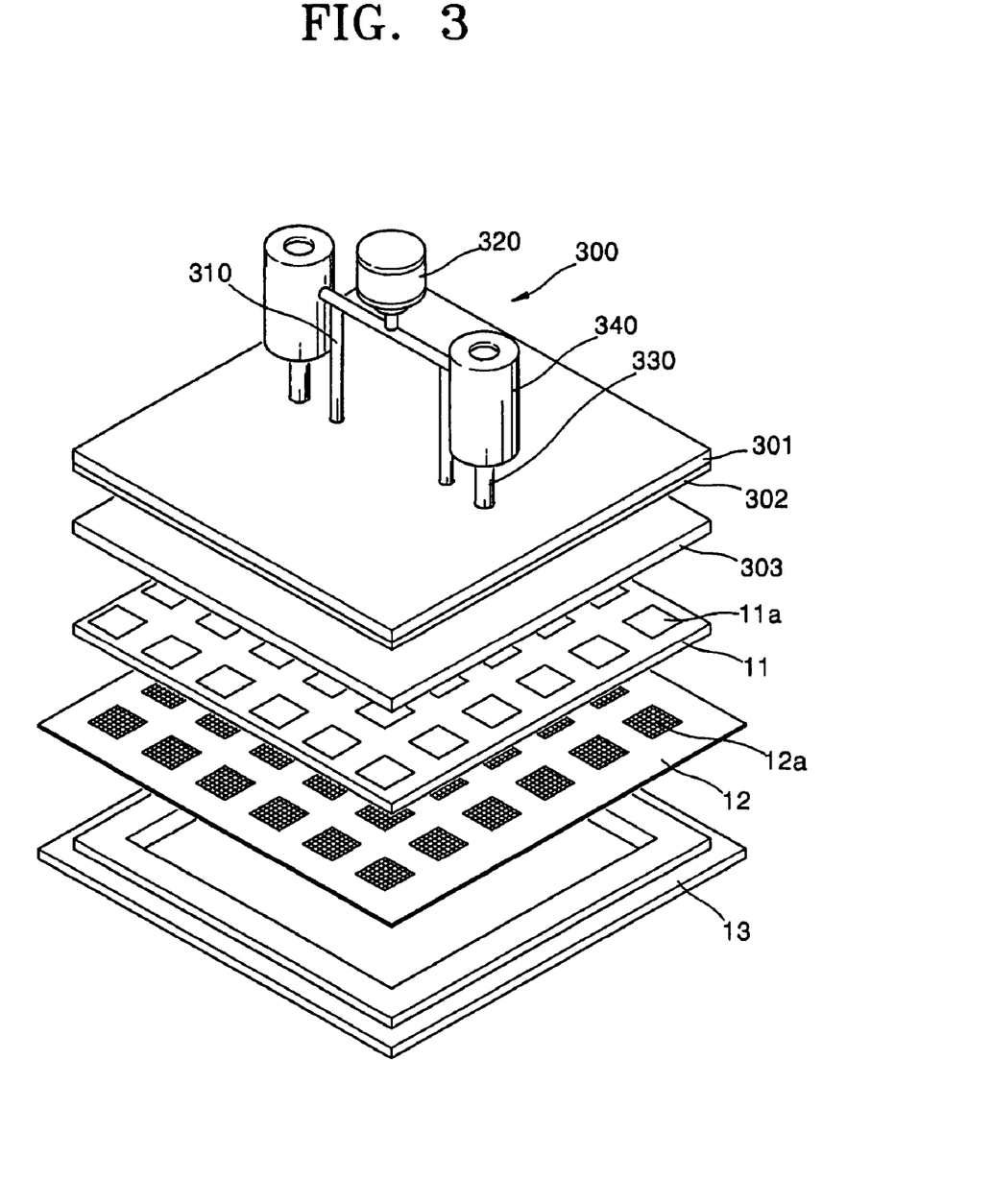
FIG. 3 is a perspective view of a device for fixing a substrate according to an embodiment of the present invention.

FIG. 3 shows a device 300 to fix a substrate for a thin film sputter operation, according to an embodiment of the present invention. As shown in FIG. 3, the device 300 includes a magnet plate 301. The magnet plate 301 is, for example, a metal plate which is made of a magnetic material. A rubber magnet 302 is attached onto a lower surface of the magnet plate 301. The rubber magnet 302 is made of, for example, a high elastic material having a strong magnetism.

The magnet plate 301 onto which the rubber magnet 302 is attached is supported by a drive shaft 310. The drive shaft 310 is coupled to a drive motor 320, which supplies power to ascend and descend the drive shaft 310 The drive motor 320 may be a servo motor which allows the drive shaft 310 to ascend and descend to a predetermined target distance.

A mask pressing plate 303, which is made of, for example, a nonmagnetic material, is positioned under the rubber magnet 302. The mask pressing plate 303 is supported by guide bars 330. The guide bars 330 pass through the magnet plate 301 onto which the rubber magnet 302 is attached, so as to ascend and descend perpendicular to the magnet plate 301. The guide bars 330 are combined with guide units 340 so as to slide up and down in the guide units 340. The device 300 is installed in a vacuum atmosphere, and upper and lower portions of the guide units 340 are opened so as to have vacuum smoothly progress through the upper and lower portions of the guide units 340.

A substrate 11 is placed under the mask pressing plate 303. Pattern formation portions 11a are disposed on the substrate 11 to form a plurality of flat panel displays, for example, organic electroluminescence displays. A mask 12, in which pattern portions 12a are formed, is installed under the substrate 11 to form patterns, such as organic thin films, in the respective pattern formation portions 11a corresponding to the organic electroluminescence displays. The mask 12 is fixed by a frame 13.

A method of fixing the substrate 11 using the device 300 having the above-described structure will be now described with reference to FIGS. 3-6.

Figure 4:
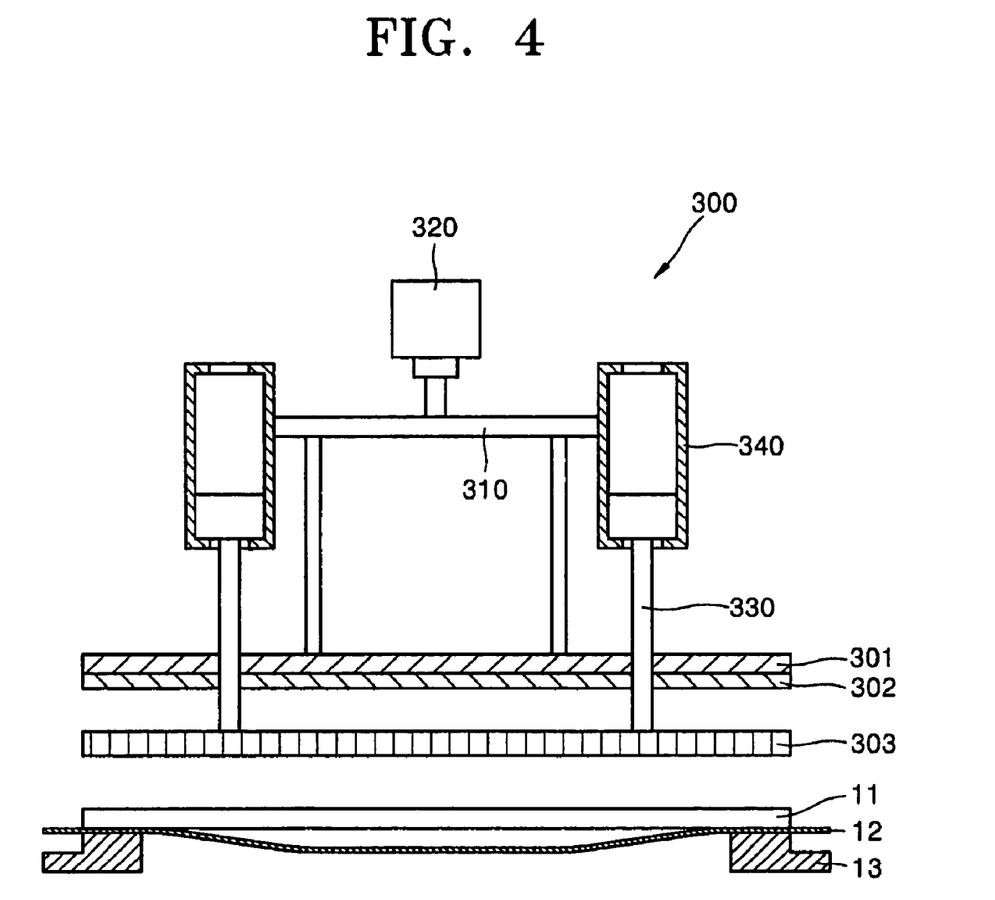
FIG. 4 is a cross-sectional view of the device shown in FIG. 3, which is aligned over the substrate.

Referring to FIG. 4, the device 300 is positioned over the substrate 11 via a robot carrier (not shown). Next, the mask 12 is correctly aligned underneath the substrate 11.

Figure 5:
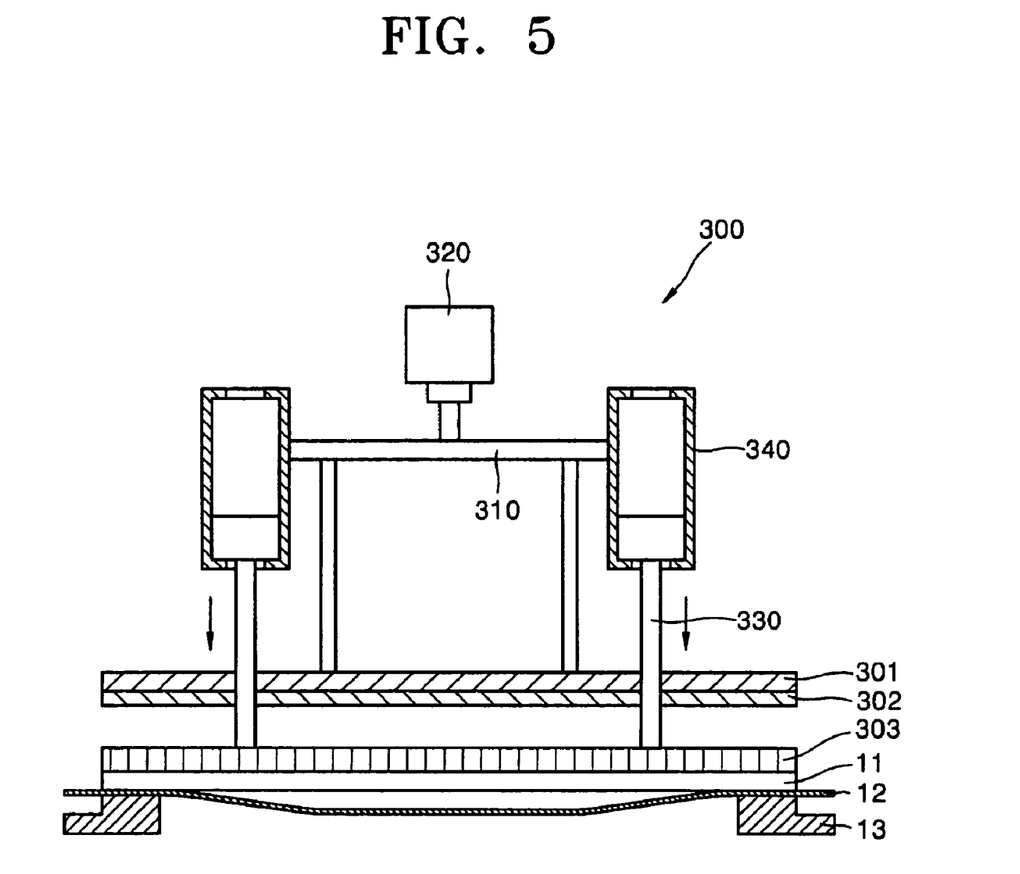
FIG. 5 is a cross-sectional view of the device shown in FIG. 3, which descends toward the substrate.

As shown in FIG. 5, the mask pressing plate 303 descends toward a back surface of the substrate 11. The mask pressing plate 303 adheres closely to the back surface the substrate 11 as the guide bars 330 slide down through the guide units 340 by, for example, their own weight. Here, since the magnet plate 301, onto which the rubber plate 302 is attached, does not move, the alignment of the mask 12 underneath the substrate 11 is not dislocated by a magnetic force.

On the other hand, the mask pressing plate 303 may not descend while the substrate 11 and the mask 12 may ascend via an additional elevating unit (not shown) so as to have the substrate 11 adhere closely to a front surface of the mask pressing plate 303.

As described above, the mask pressing plate 303 adheres closely to the substrate 11.

Figure 6:
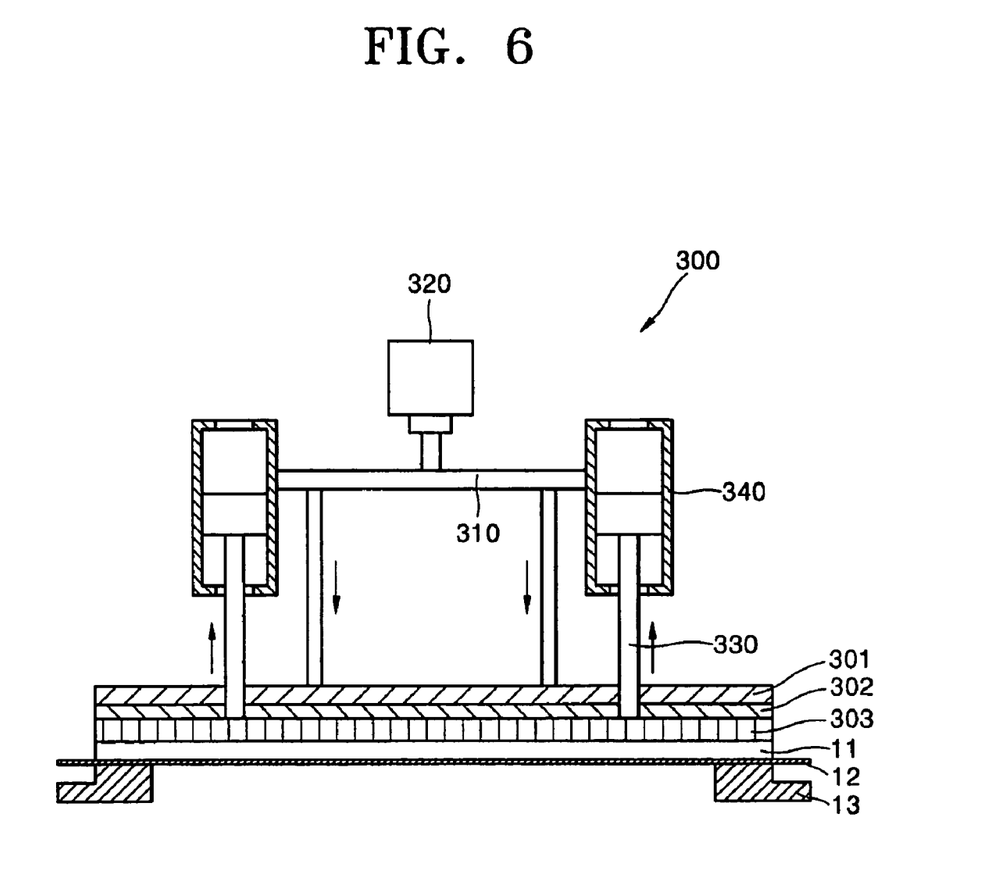
FIG. 6 is a cross-sectional view of the device shown in FIG. 3, which adheres closely to the substrate.

As shown in FIG. 6, the magnet plate 301, onto which the rubber plate 302 is attached and which is connected to the drive shaft 310, descends by a driving force of the drive motor 320. The rubber plate 302 contacts a back surface of the mask pressing plate 303. Thus, the mask 12 underneath the substrate 11 adheres closely to a lower surface of the substrate 11 by a magnetic force of, for example, the magnet plate 301.

Here, the substrate 11 has already been supported by the mask pressing plate 303. Thus, the mask 12 is not dislocated underneath the substrate 11. The substrate 11 to which the mask 12 is closely adhered is supplied with a pressure, for example, equal to a weight of the mask pressing plate 303. Here, the pressure can be controlled.

Figure 7:
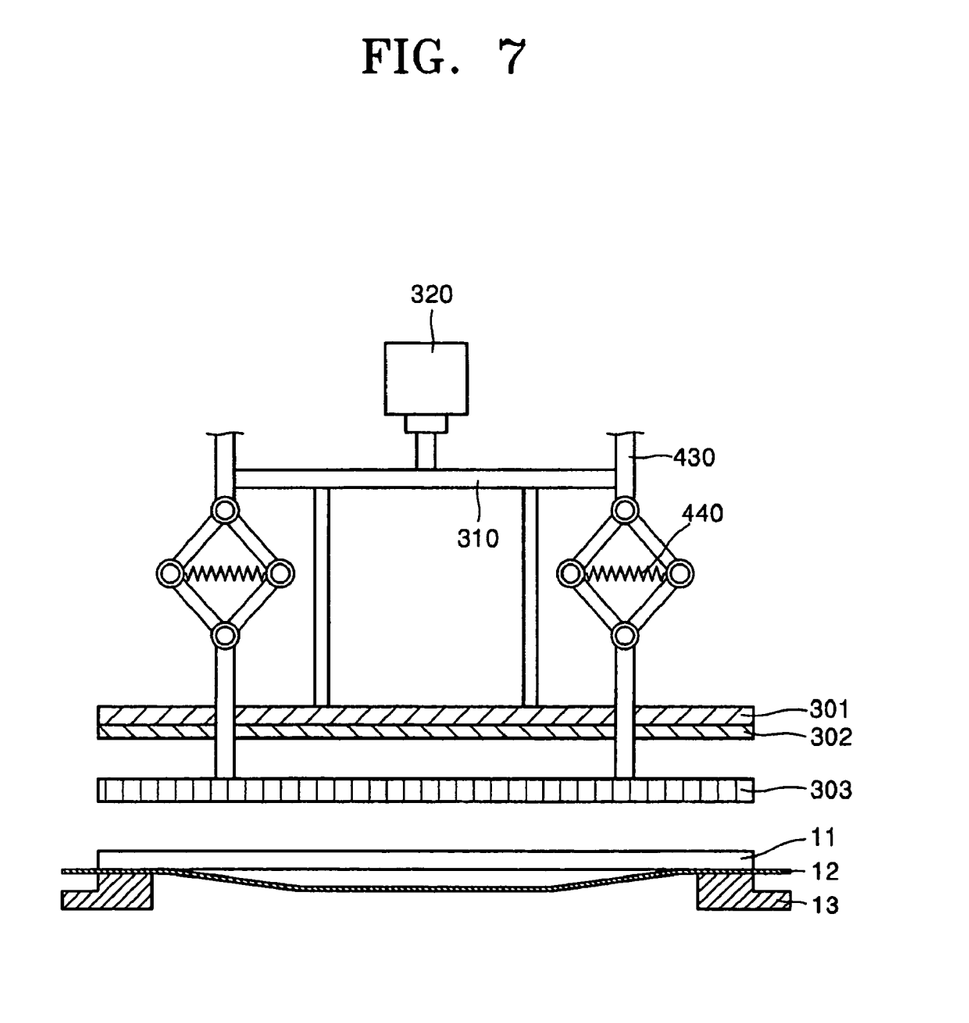
FIG. 7 is a cross-sectional view of a device for fixing a substrate according to another embodiment of the present invention.

FIG. 7 shows a device 300 for fixing a substrate 11 according to another embodiment of the present invention. In other words, where a pressure is low, as shown in FIG. 7, elastic bias units 440, for example, springs, are installed at guide bars 430 which support a mask pressing plate 303, so as to apply an additional pressure to the weight of the mask pressing plate 303. In a case where a pressure is high, the mask pressing plate 303 may be formed of a material having an appropriate weight to control the pressure.

The above-described device to fix a substrate for a thin film sputter, according to the present invention, and the method of fixing the substrate using the device have the following non-exclusive advantages.

Since a mask pressing plate and a rubber plate multi-step support a substrate, a mask is not dislocated underneath the substrate. Furthermore, the mask can be kept from slipping on the substrate, and thus the substrate can be prevented from being scratched.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of fixing a substrate with respect to a mask provided below the substrate, using a device having a magnetic body supported by a drive shaft, a mask pressing plate, and a driver including guide bars supporting the mask pressing plate and passing through the magnetic body, provided above the substrate, the method comprising:

adhering the mask pressing plate to a back surface of the substrate by using the guide bars;

allowing the magnetic body to move separately from the mask pressing plate by using the drive shaft and toward the back surface of the substrate which is supported by the mask pressing plate; and adhering the mask underneath the substrate to a front surface of the substrate by using a magnetic force of the magnetic body.

2. The method of claim 1, wherein the adhering of the mask pressing plate to the substrate comprises moving the mask pressing plate towards the back surface of the substrate, perpendicular to the magnetic body, so as to adhere the mask pressing plate to the substrate.

3. The method of claim 1, wherein the adhering the mask pressing plate to the substrate comprises moving the substrate and the mask underneath the substrate toward a front surface of the mask pressing plate, at the same time, so as to adhere the substrate to the mask pressing plate.

4. The method of claim 1, wherein the allowing the magnetic body to move toward the back surface of the substrate comprises moving the magnetic body toward a back surface of the mask pressing plate, where the mask pressing plate presses the back surface of the substrate.

5. The method of claim 1, wherein the adhering of the mask pressing plate to the substrate further comprises applying a predetermined pressure to the mask pressing plate working with the movement of the mask pressing plate toward the substrate.

6. A device for fixing a substrate with respect to a mask provided below the substrate, the device comprising:

a mask pressing plate which is positioned over a back surface of the substrate;

an elevating unit which moves the substrate and the mask toward the mask pressing plate so as to have the back surface of the substrate contact the mask pressing plate;

a magnetic body which is placed over the mask pressing plate and moves toward the mask pressing plate so as to adhere the mask to the substrate using a magnetic force of the magnetic body; and a driving unit which moves the magnetic body.

7. The device of claim 6, wherein:

the mask pressing plate is a nonmagnetic plate, and the magnetic body comprises a magnet plate and a rubber magnet which is attached onto a lower surface of the magnet plate.

8. A device for fixing a substrate with respect to a mask provided below the substrate, the device comprising:

a multi-step fixing unit which contacts a back surface of the substrate with a non-magnetic part and adheres the mask to a front surface of the substrate using a magnetic force of a magnetic part; and a driving unit which drives the multi-step fixing unit including guide bars supporting the non-magnetic unit and passing through the magnetic part and a drive shaft supporting the magnetic part, wherein the non-magnetic part is independent of the magnetic part.

9. The device of claim 8, wherein the guide bars further comprise an elastic bias unit which biases the non-magnetic part to contact the substrate.

10. The device of claim 8, further comprising an elevating unit which moves the substrate and the mask to so as to have the substrate contact the non-magnetic part.

11. The device of claim 8, wherein the magnetic part comprises a magnet plate and a rubber magnet which is attached onto a lower surface of the magnet plate.

* * * * *